US006258489B1

(12) United States Patent
Stanton et al.

(10) Patent No.: US 6,258,489 B1
(45) Date of Patent: Jul. 10, 2001

(54) MASK DESIGN UTILIZING DUMMY FEATURES

(75) Inventors: William Stanton; Vishnu K. Agarwal, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/349,983

(22) Filed: Jul. 9, 1999

(51) Int. Cl.[7] ................................. G03F 9/00
(52) U.S. Cl. ................................. 430/5
(58) Field of Search .................. 430/5, 322, 396; 378/34, 35

(56) References Cited

U.S. PATENT DOCUMENTS

| | | | |
|---|---|---|---|
| 5,468,577 | * 11/1995 | Bae | 430/5 |
| 5,707,765 | 1/1998 | Chen | 430/5 |
| 5,795,682 | 8/1998 | Garza | 430/5 |
| 5,821,014 | 10/1998 | Chen et al. | 430/5 |
| 6,048,647 | * 4/2000 | Miyazaki et al. | 430/5 |

* cited by examiner

Primary Examiner—S. Rosasco
(74) Attorney, Agent, or Firm—Dickstein Shapiro Morin & Oshinsky LLP (57) ABSTRACT

A photolithography mask includes dummy features adjacent to features to be printed (printable features). The dummy features are smaller than the resolution (which is approximately equal to the critical dimension) of the photolithography system so that the resist is not fully developed in the areas of the dummy features. Thus, the dummy features will not be etched into the surface below. However, the proximity effects caused by the dummy features will act to suppress sidelobes and/or increase the depth of focus. Dummy features may be provided adjacent to both isolated and densely-packed printable features, thereby equalizing the proximity effects acting on both types features so that isolated printable features will print approximately the same as densely-packed printable features and the printability of both isolated and closely-packed features will be enhanced. The size and shape of the dummy features may be adjusted for the particular application.

37 Claims, 6 Drawing Sheets

MASK DESIGN UTILIZING DUMMY FEATURES

BACKGROUND OF THE INVENTION

1. Field of the Invention

The present invention relates generally to the field of semiconductor fabrication and more particularly to a mask used in the photolithography process during semiconductor fabrication.

2. Description of the Related Art

In the semiconductor industry, photolithography is used to transfer patterns corresponding to a circuit layout from a mask to a semiconductor wafer to form a semiconductor device. The layout, and hence the patterns on the masks, are made to conform to dimensional "design rules," which are determined by photolithographic and semiconductor processing parameters and circuit design criteria. Adhering to these design rules ensures that patterns on the mask transfer properly to the semiconductor wafer and ensures circuit functionality. One important design rule that determines the overall size and density of the device is the critical dimension, which is defined as the smallest width of a line or the smallest space between two lines.

Once the layout of the circuit has been created, an exposure tool is used to irradiate a layer of photoresist on the semiconductor wafer. An important limiting characteristic of the tool is its resolution. The resolution of an exposure tool is defined as the minimum feature that the exposure tool can repeatedly expose onto the wafer. As the critical dimensions of a mask layout approach the resolution limit of the lithography system, proximity effects begin to influence the manner in which features on a mask transfer to the resist layer such that the masked and actual layout patterns begin to differ. Proximity effects are known to result from optical diffraction in the projection system. This diffraction causes adjacent features to interact with each other in such a way as to produce pattern-dependent variations. One specific variation occurs when features are designed to have the same dimension but are placed in different proximity to other features in a layout. The difference in proximity causes features such as contact holes which are in close proximity to other features to print differently from features which are relatively isolated from other features. This variance between isolated features and closely-packed features is detrimental to process margin/latitude. As used herein, an isolated feature refers to a feature that is not appreciably affected during the photolighography process by proximity effects from other features, while a closely-packed feature refers to a feature that is appreciably affected during the photolithograph process by proximity effects from other features.

The proximity effects described above are not always detrimental. Diffracted exposure radiation from neighboring closely-packed features can actually interact to reduce sidelobe effects, thereby increasing depth of focus and hence process margin/latitude. Accordingly, and perhaps counter-intuitively, it is possible to achieve a smaller feature size and/or improved printing characteristics such as edge sharpness for closely-packed features than is possible for isolated features.

What is needed is a method and/or mask for, that can uniformly print both isolated and densely-packed features and that can improve printing of all features, whether closely-packed or isolated.

SUMMARY OF THE INVENTION

The present invention overcomes to a great extent the aforementioned problems by placing dummy features adjacent to features to be printed (referred to herein as printable features) on a photolithography mask. The dummy features are smaller than the resolution (which is approximately equal to the critical dimension) of the photolithography system so that the resist is not fully developed in the areas of the dummy features. Thus, the dummy features will not be etched into the surface below. However, the proximity effects caused by the dummy features will act to suppress sidelobes and/or increase the depth of focus. Dummy features may be provided adjacent to both isolated and closely-packed printable features, thereby equalizing the proximity effects acting on both types features so that isolated printable features will print approximately the same as densely-packed printable features and both will be enhanced.

In one embodiment, a mask is formed with dummy features in the form of dummy contact openings provided around printable contact openings. The dummy contact openings are essentially contact openings with an island disposed therein. Various parameters associated with the dummy contact opening, including the width of the island, the spacing between the edges of the island and the inner edges of the opening, and the spacing between the closest edges of the dummy contact opening and the printable contact opening, may be adjusted to maximize depth of focus as well as the uniformity of the isolated and densely-packed contact openings.

BRIEF DESCRIPTION OF THE DRAWING

The foregoing and other advantages and features of the invention will become more apparent from the detailed description of the preferred embodiments of the invention given below with reference to the accompanying drawing in which.

DETAILED DESCRIPTION OF THE PREFERRED EMBODIMENTS

The present invention will be illustrated through a description of various mask portions for defining contact openings. Numerous specific details, such as shapes, dimensions, etc., are set forth in order to provide a thorough understanding of the present invention. It will be obvious, however, to one skilled in the art that the present invention is capable of many different embodiments and that the present invention may be practiced without the specific details set forth herein. Accordingly, the drawing and description herein are to be regarded as illustrative in nature and not as restrictive.

Figure 1:
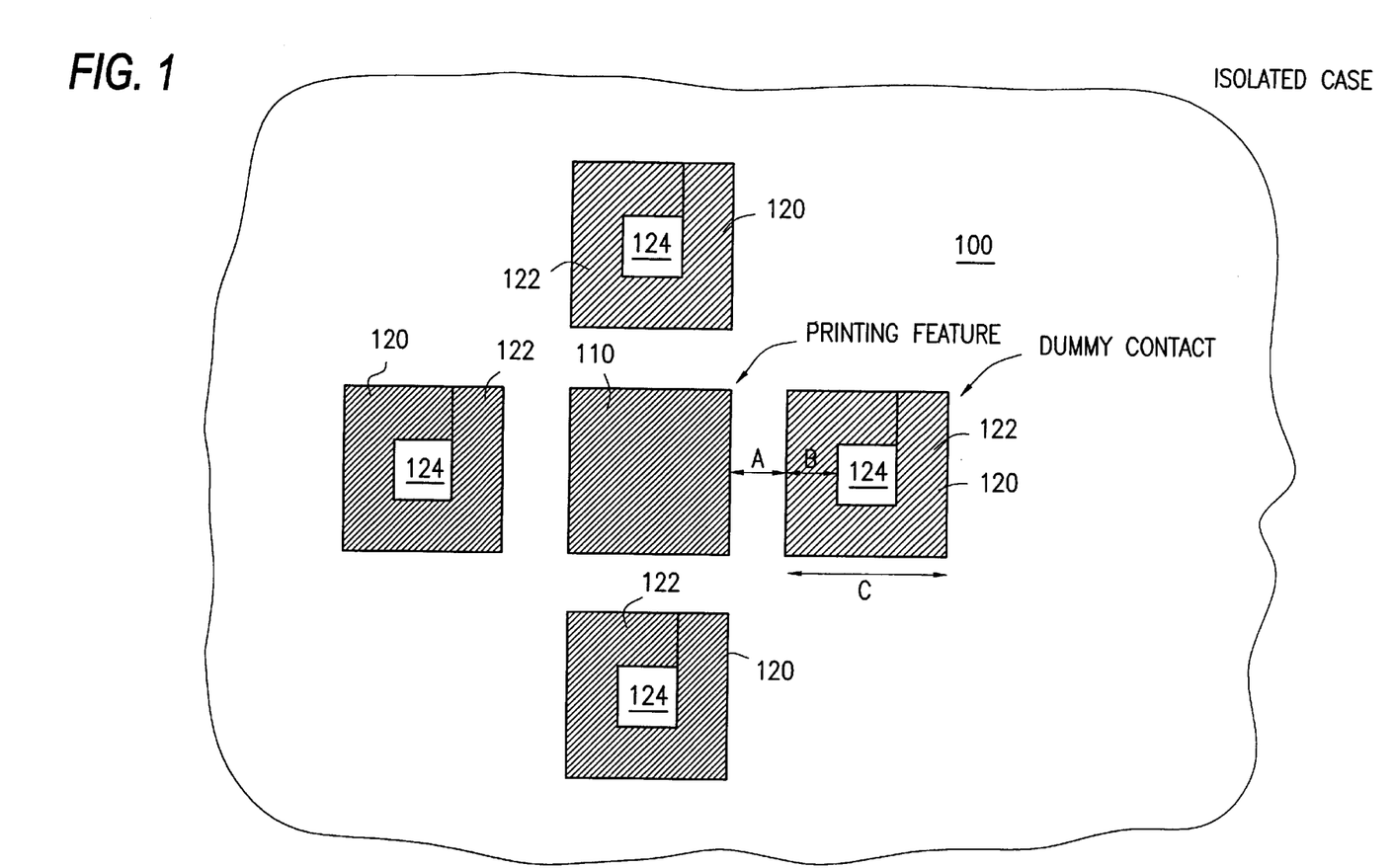
FIG. 1 is a drawing of a portion of a non-phase shift mask with an isolated contact and accompanying dummy contacts according to one embodiment of the present invention.

The invention will now be described with reference to FIG. 1. FIG. 1 illustrates a portion of a mask 100 with an isolated printable contact opening 110 defined therein. The printable contact opening 110 is surrounded on all four sides by dummy contact openings 120 which have been added in accordance with the present invention. Each of the dummy contact openings 120 is spaced apart from a respective side of printable contact opening 110 by a distance A. Each dummy contact opening includes a central non-transmissive island 124 disposed within a transmissive portion 122. The width of the transmissive portion (the distance from the edge of the transmissive portion 122 to the edge of the island 124) is B, while the width of the entire dummy contact opening 120 is C as shown in FIG. 1.

It will be apparent to those of ordinary skill in the art that the portions of the mask 100 referred to above as transmissive and non-transmissive could easily be reversed; that is, the transmissive portions could be made non-transmissive and the non-transmissive portions could be made transmissive. The actual choice of which sections are transmissive and which are not depends upon whether the mask will be used to expose positive or negative photoresist. The non-transmissive portions are those portions of the substrate covered by an opaque coating, such as chrome.

The dummy feature parameters may also be varied. For example, the general shape (e.g. square, circle, rectangle) of the features may be varied. The sizes of the dummy features may also be varied. For example, in the mask of FIG. 1, three parameters of the dummy contact openings 120 may be varied: the distance A from the dummy contact 120 to the printable contact 110, the distance B between the central island 124 and the closest outer edge of the dummy contact 110, and the total width C of the dummy contact 120. It is apparent that the parameter B may also be expressed in terms of the width of the central island 124 since the wider the central island 124, the narrower the distance B. One constraint on these parameters is that the dummy contact not be printable. A general rule of thumb to ensure that the dummy contact does not print is that the width of the non-central island portions of the dummy contact opening should be less than approximately one third of the exposure radiation wavelength. Therefore, assuming an exposure wavelength of 248 nm (which is usually used for deep UV photolithography processes), the parameter B should be kept less than approximately 248 nm/3=83 nm. However, considering that the diagonal measurement from one corner of the island 124 to the closest corresponding corner will be approximately 1.4 times greater than the distance B (assuming both the dummy contact opening 120 and the center island 124 are squares), the parameter B should be kept below approximately 83/1.4=60 nm.

The parameters A,B,C may be adjusted quite a bit even when constrained by the considerations discussed above. How to select these parameters to best suit the specific photolithography process is a complex matter involving much calculation. Fortunately, the existence of software modeling tools has greatly simplified this task. Using a modeling tool such as FAIM (Fast Aerial Image Model), it is possible to quickly and easily modify the A, B and C parameters to arrive, through a simple trial and error process, at values for these parameters that meet the printability (e.g. depth of focus and/or process latitude/margin) requirements for the desired mask.

Figure 2:
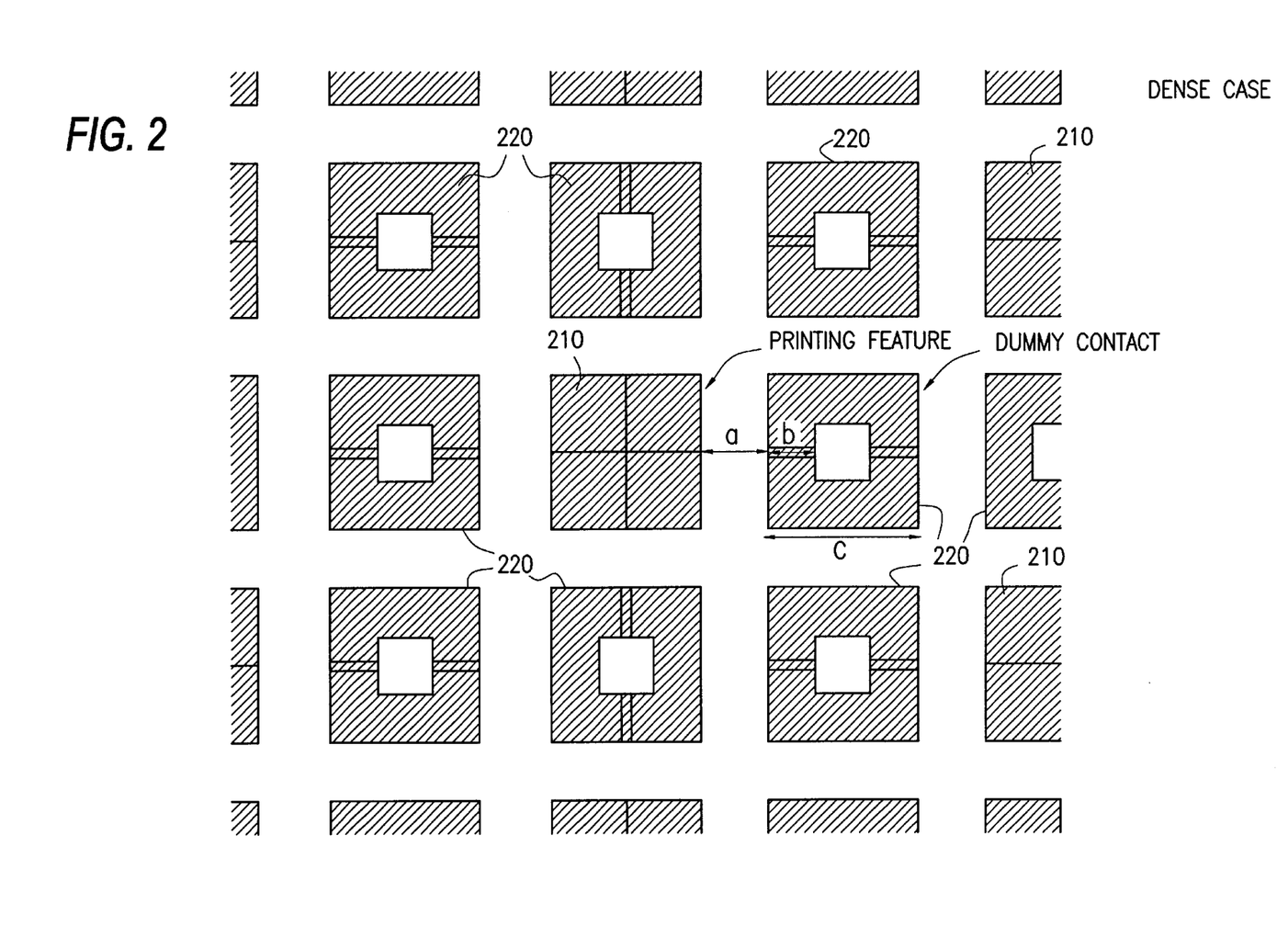
FIG. 2 is a drawing of a portion of a non-phase shift mask with dense contacts and accompanying dummy contacts according to another embodiment of the present invention.

FIG. 2 is a portion of a mask like FIG. 1 with dummy contact openings 220 surrounding printable contact openings 210. Unlike the mask portion 100 of FIG. 1, the printable contacts 210 are closely-packed. The inclusion of dummy contact openings 220 between the closely-packed printable contact openings 210 has two effects. First, the printability of the printable contact openings 210 is enhanced. Second, if another portion of the mask 200 has isolated contact openings such as the contact opening 110 of FIG. 1, including dummy contact openings around both isolated and closely-packed printable contact openings makes the printing of both more uniform. Both effects increase process latitude/margin.

Figure 3:
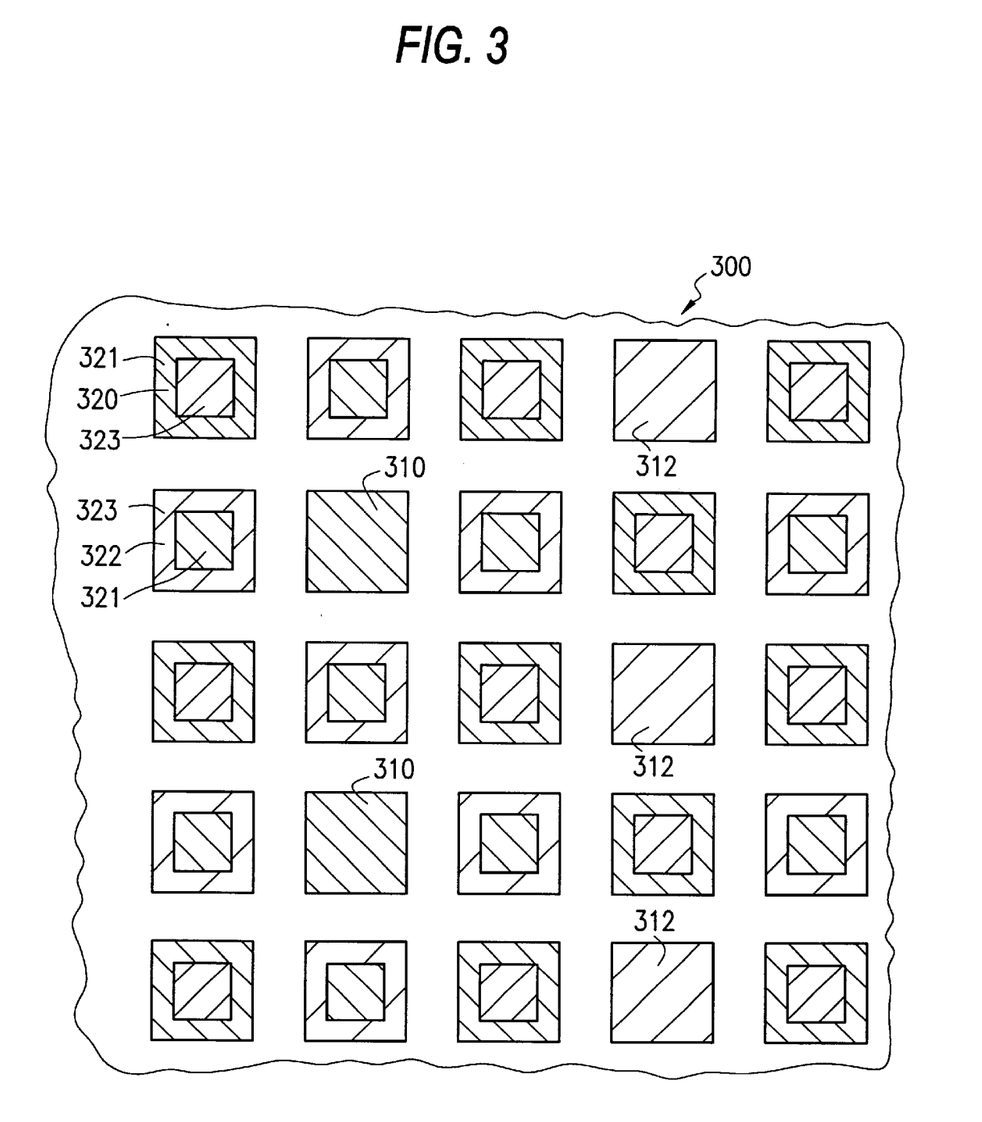
FIG. 3 is a drawing of an alternating phase shift mask with closely-packed contacts according to another embodiment of the present invention.
Figure 4:
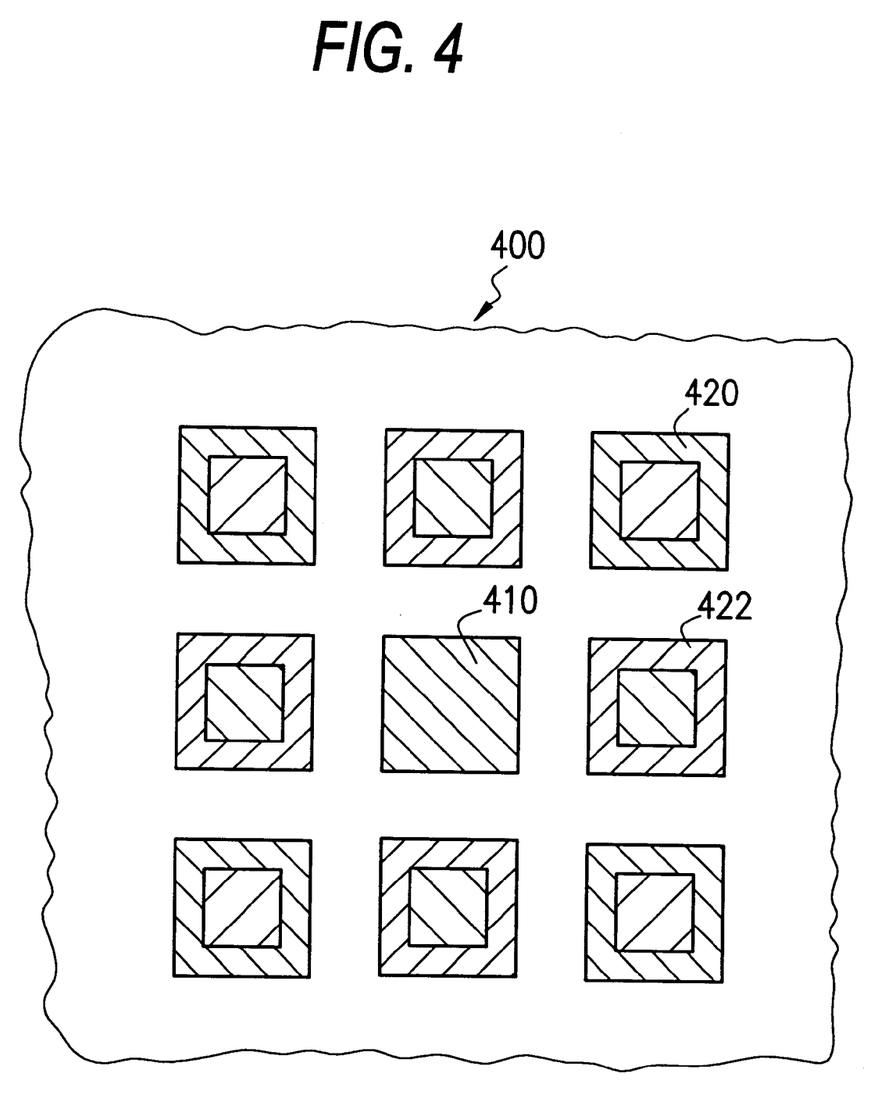
FIG. 4 is a drawing of an alternating phase shift mask with an isolated contact according to another embodiment of the present invention.

Dummy features may also be used with phase shifting masks. FIG. 3 illustrates an alternating phase shift mask 300 in accordance with another embodiment of the present invention. The mask 300 includes densely packed non-shifted printable contact openings 310 and 1800 phase-shifted printable contact openings 312. Also included are dummy contacts 320, 322 with alternating phase-shifted and non-phase-shifted regions 321, 323. FIG. 4 illustrates an alternating phase shift mask 400 with an isolated contact opening 310.

Figure 5:
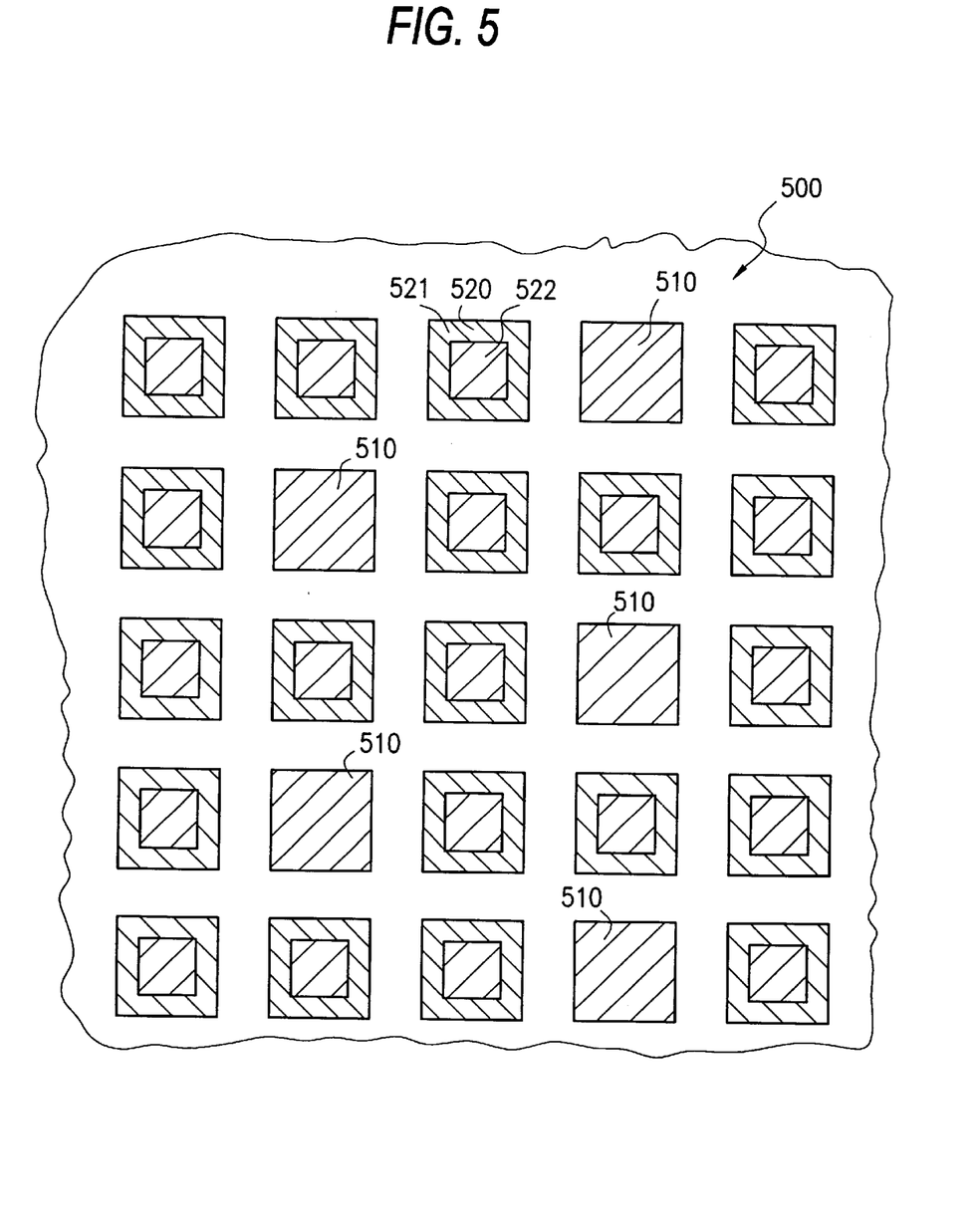
FIG. 5 is a drawing of an attenuated phase shift mask with closely-packed contacts according to another embodiment of the present invention.
Figure 6:
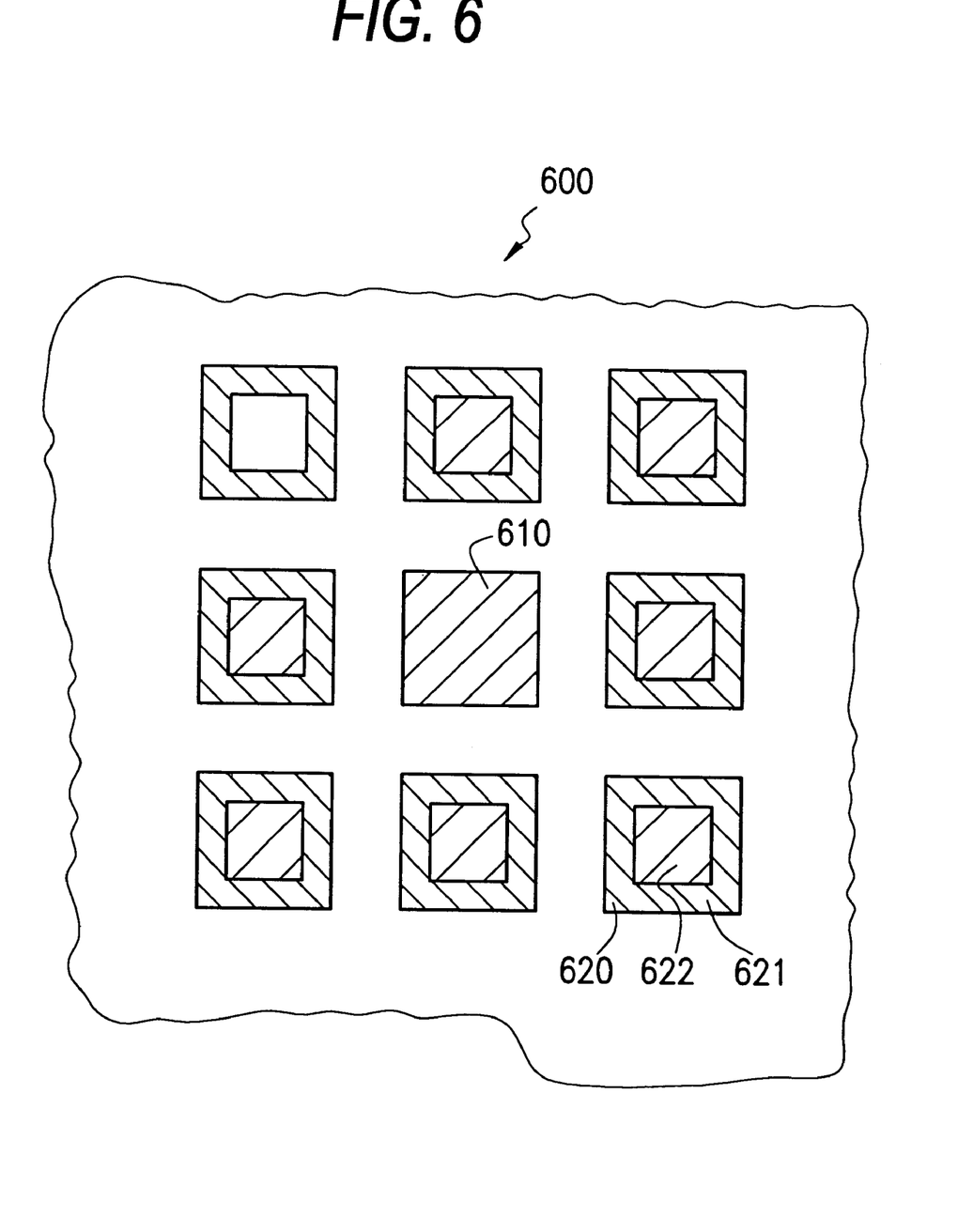
FIG. 6 is a drawing of an attenuated phase shift mask with an isolated contact according to another embodiment of the present invention.

Attenuated phase shifting masks with dummy features are also possible. For example, FIG. 5 illustrates an attenuated phase shifting mask 500 with closely-packed printable contact openings 510 and dummy contact openings 520 including a transmissive center island 522 disposed within a partially transmissive (attenuated), 180° phase-shifted region 521. FIG. 6 illustrates a mask similar to that of FIG. 5 with an isolated contact opening 610 surrounded by dummy contact openings 620.

The use of dummy features for various types of masks has been illustrated. The dummy features, although not printed, serve to enhance the printability of printable features by decreasing sidelobe effects in attenuated reticles, thereby increasing process margin/latitude. The parameters of the dummy features may be adjusted, preferably through use of modeling software, to best realize the foregoing benefits. The dummy features may be employed with phase shift masks and non-phase shift masks. Although contact openings in the shape of a square have been discussed in connection with the preferred embodiments, other shapes and types of features may also be used. While the invention is particularly well suited for symmetrical features, the invention may also be used with non-symmetrical features.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method for making a mask for use in a photolithography process, the method comprising the steps of:
   forming printable features on a mask substrate; and
   forming dummy features on the mask substrate, the dummy features being located relative to the printable features such that the dummy features enhance the printability of the printable features, wherein the dummy features include an island disposed within a surrounding portion, wherein said island is one of a substantially transmissive region, and wherein if the island is a substantially non-transmissive region, the surrounding portion is substantially transmissive and wherein if the island is a substantially transmissive region, the surrounding portion is substantially non-transmissive.

2. The method of claim 1, wherein the step of forming printable features includes the steps of forming printable isolated features and forming isolated printable closely-packed features.

3. The method of claim 1, wherein the surrounding portion is substantially transmissive and the island is substantially non-transmissive.

4. The method of claim 1, wherein the island is substantially transmissive and the surrounding portion is substantially non-transmissive.

5. The method of claim 1, wherein each of the dummy features is symmetrical about at least one axis.

6. The method of claim 1, wherein each of the dummy features is substantially a square.

7. The method of claim 1, wherein the dummy features and the printable features are formed so as to produce no relative phase shift of radiation used for development in the photolithography process with respect to other features.

8. The method of claim 1, wherein a first portion of the printable features are formed so as to produce a relative phase shift of radiation used for development in the photolithography process with respect to a second portion of the printable features.

9. The method of claim 8, wherein the relative phase shift is approximately one hundred and eighty degrees.

10. The method of claim 8, wherein the dummy features are formed with a first portion and a second portion, the first portion producing a relative phase shift of radiation used for development in the photolithography process with respect to the second portion.

11. The method of claim 10, wherein the dummy features are formed such that alternating dummy features have the first portion surrounded by the second portion and the second portion surrounded by the first portion respectively.

12. The method of claim 1, wherein the dummy features are formed with a first portion and a second portion, the first portion being partially transmissive and producing a relative phase shift of radiation used for development in the photolithography process with respect to the second portion.

13. The method of claim 12, wherein the relative phase shift is approximately one hundred and eighty degrees.

14. The method of claim 1, wherein the printable features are formed with four sides and the dummy features are formed with four sides and one dummy feature is located along each side of the printable features.

15. The method of claim 1, wherein a width of the transmissive portion is less than approximately one third of the wavelength of the radiation used for development in the photolithography process.

16. The method of claim 1, wherein the width of the non-transmissive portion is less than approximately one third of the wavelength of the radiation used for development in the photolithography process.

17. A mask for use in the photolithography process, the mask comprising:
a mask substrate;
printable features on the mask substrate; and
dummy features formed on the mask substrate, the dummy features being located relative to the printable features such that the dummy features enhance the printability of the printable features, wherein the dummy features include an island disposed within a surrounding portion, wherein said island is one of a substantially non-transmissive region and a substantially transmissive region, and wherein if the island is a substantially non-transmissive region, the surrounding portion is substantially transmissive and wherein if the island is a substantially transmissive region, the surrounding portion is substantially non-transmissive.

18. The mask of claim 17, wherein the printable features include isolated printable features and closely-packed printable features.

19. The mask of claim 17, wherein the surrounding portion is substantially transmissive and the island is substantially non-transmissive.

20. The mask of claim 17, wherein the island is substantially transmissive and the surrounding portion is substantially non-transmissive.

21. The mask of claim 17, wherein the non-transmissive portions comprise portions of the substrate covered by chrome.

22. The mask of claim 17, wherein each of the dummy features is symmetrical about at least one axis.

23. The mask of claim 17, wherein each of the dummy features is symmetrical about two perpendicular axes.

24. The mask of claim 17, wherein each of the dummy features is substantially a square.

25. The mask of claim 17, wherein the dummy features and the printable features produce no relative phase shift of radiation used for development in the photolithography process.

26. The mask of claim 17, wherein a first portion of the printable features produce a relative phase shift of radiation used for development in the photolithography process with respect to a second portion of the printable features.

27. The mask of claim 26, wherein the relative phase shift is approximately one hundred and eighty degrees.

28. The mask of claim 26, wherein the dummy features are formed with a first portion and a second portion, the first portion producing a relative phase shift of radiation used for development in the photolithography process with respect to the second portion.

29. The mask of claim 26, wherein alternating dummy features have the first portion surrounded by the second portion and the second portion surrounded by the first portion respectively.

30. The mask of claim 17, wherein the dummy features have a first portion and a second portion, the first portion being partially transmissive and producing a relative phase shift of radiation used for development in the photolithography process with respect to the second portion.

31. The mask of claim 30, wherein the relative phase shift is approximately one hundred and eighty degrees.

32. The mask of claim 17, wherein the printable features are formed with four sides and the dummy features are formed with four sides and one dummy feature is located along each side of the printable features.

33. The mask of claim 17, wherein a width of the transmissive portion is less than approximately one third of the wavelength of the radiation used for development in the photolithography process.

34. The mask of claim 17, wherein the width of the non-transmissive portion is less than approximately one third of the wavelength of the radiation used for development in the photolithography process.

35. A method for designing a mask for use in a photolithography process, the method comprising the steps of:

modeling a mask including printable features and dummy features using modeling software, the dummy features including an island disposed within a surrounding portion, wherein said island is one of a substantially non-transmissive region and a substantially transmissive region, and wherein if the island is a substantially non-transmissive region, the surrounding portion is substantially transmissive and wherein if the island is a substantially transmissive region, the surrounding portion is substantially non-transmissive, the transmissive portions being sized so as not to print during the photolithography process, the dummy features having a first parameter representing the distance of the dummy feature to a nearest printable feature, a second parameter representing the size of the entire dummy feature, and a third parameter representing the size of the island of the dummy feature; and modifying at least one of the first, second or third parameters such that the printability of the printable features is enhanced.

36. The method of claim 35, wherein all three parameters are modified.

37. The method of claim 35, wherein the third parameter is expressed in terms of the distance between an outer edge of the island of the dummy feature and an outer edge of the surrounding portion of the dummy feature.

* * * * *

UNITED STATES PATENT AND TRADEMARK OFFICE
CERTIFICATE OF CORRECTION

PATENT NO. : 6,258,489 B1
DATED : July 10, 2001
INVENTOR(S) : William Stanton et al.

It is certified that error appears in the above-identified patent and that said Letters Patent is hereby corrected as shown below:

<u>Column 4,</u>
Line 14, "1800" should be -- 180° --; and
Line 66, after "substantially" insert -- non-transmissive region and a substantially --.

Signed and Sealed this

Twenty-first Day of June, 2005

JON W. DUDAS
*Director of the United States Patent and Trademark Office*